United States Patent
Rawaswamy (10) Patent No.: US 9,431,459 B2
(45) Date of Patent: Aug. 30, 2016

(54) SWITCHING COMPONENTS AND MEMORY UNITS

(71) Applicant: Micron Technology, Inc., Boise, ID (US)

(72) Inventor: Durai Vishak Nirmal Rawaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/989,625

(22) Filed: Jan. 6, 2016

(65) Prior Publication Data

US 2016/0118441 A1    Apr. 28, 2016

Related U.S. Application Data

(62) Division of application No. 14/184,400, filed on Feb. 19, 2014, now Pat. No. 9,263,675.

(51) Int. Cl.
*H01L 29/02* (2006.01)
*H01L 27/24* (2006.01)
*H01L 45/00* (2006.01)

(52) U.S. Cl.
CPC ....... *H01L 27/2409* (2013.01); *H01L 27/2463* (2013.01); *H01L 45/1253* (2013.01); *H01L 45/1266* (2013.01); *H01L 45/14* (2013.01); *H01L 45/145* (2013.01); *H01L 45/146* (2013.01); *H01L 45/148* (2013.01); *H01L 45/149* (2013.01)

(58) Field of Classification Search
CPC .......................... H01L 45/145; H01L 45/149
USPC ....................................... 257/2, 3
See application file for complete search history.

(56) References Cited

U.S. PATENT DOCUMENTS

| 8,975,610 | B1* | 3/2015 | Mathur | H01L 45/00 257/2 |
|---|---|---|---|---|
| 8,981,327 | B1* | 3/2015 | Mathur | H01L 45/00 257/2 |
| 2007/0029557 | A1* | 2/2007 | Vaufrey | H01L 51/5221 257/94 |
| 2008/0042119 | A1 | 2/2008 | Sandoval | |
| 2009/0298224 | A1 | 12/2009 | Lowrey | |
| 2010/0091561 | A1 | 4/2010 | Lowrey et al. | |
| 2011/0134685 | A1 | 6/2011 | Kau et al. | |
| 2012/0140553 | A1 | 6/2012 | Kalb et al. | |
| 2013/0135925 | A1 | 5/2013 | Scheuerlein | |
| 2014/0209892 | A1* | 7/2014 | Kuo | G11C 8/10 257/43 |
| 2015/0029775 | A1* | 1/2015 | Ravasio | H01L 45/1666 365/63 |
| 2015/0070965 | A1* | 3/2015 | Bandyopadhyay | G11C 13/0059 365/148 |

\* cited by examiner

FOREIGN PATENT DOCUMENTS

WO  WO PCT/US2014/066177    2/2015

*Primary Examiner* — David Vu
*Assistant Examiner* — Brandon Fox
(74) *Attorney, Agent, or Firm* — Wells St. John P.S.

(57) ABSTRACT

Some embodiments include a switching component which includes a selector region between a pair of electrodes. The selector region contains silicon doped with one or more of nitrogen, oxygen, germanium and carbon. Some embodiments include a memory unit which includes a memory cell and a select device electrically coupled to the memory cell. The select device has a selector region between a pair of electrodes. The selector region contains semiconductor doped with one or more of nitrogen, oxygen, germanium and carbon. The select device has current versus voltage characteristics which include snap-back voltage behavior.

17 Claims, 11 Drawing Sheets

PRIOR ART

SWITCHING COMPONENTS AND MEMORY UNITS

RELATED PATENT DATA

This patent resulted from a divisional of U.S. patent application Ser. No. 14/184,400, which was filed Feb. 19, 2014, and which is hereby incorporated herein by reference.

TECHNICAL FIELD

Switching components and memory units.

BACKGROUND

Memory is one type of integrated circuitry, and is used in systems for storing data. Memory is usually fabricated in one or more arrays of individual memory cells. The memory cells are configured to retain or store information in at least two different selectable states. In a binary system, the states are considered as either a "0" or a "1". In other systems, at least some individual memory cells may be configured to store more than two levels or states of information.

Integrated circuit fabrication continues to strive to produce smaller and denser integrated circuits. Accordingly, there has been substantial interest in memory cells that can be utilized in structures having programmable material between a pair of electrodes; where the programmable material has two or more selectable resistive states to enable storing of information. Examples of such memory cells are resistive RAM (RRAM) cells, phase change RAM (PCRAM) cells, and programmable metallization cells (PMCs)—which may be alternatively referred to as a conductive bridging RAM (CBRAM) cells, nanobridge memory cells, or electrolyte memory cells. The memory cell types are not mutually exclusive. For example, RRAM may be considered to encompass PCRAM and PMCs. Additional example memory includes ferroelectric memory, magnetic RAM (MRAM) and spin-torque RAM.

Programmable memory cells of the types described above may be highly scalable and thus suitable for utilization in future generations of memory. However, problems are encountered in attempting to utilize such memory cells. For instance, the memory cells may be "leaky"; and accordingly may be paired with select devices in order to better control current flow to and from the memory cells.

Figure 1:
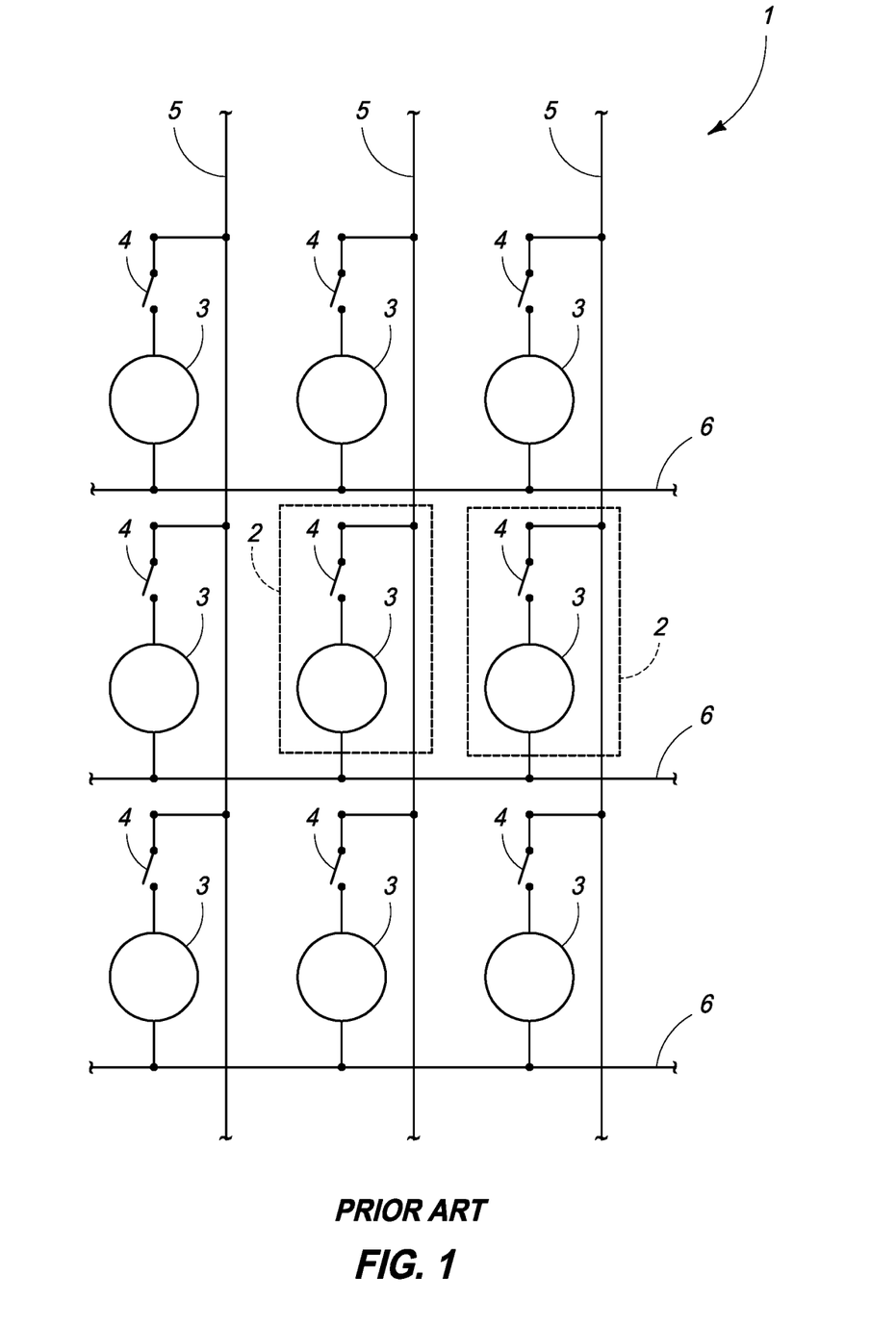
FIG. 1 schematically illustrates an example prior art memory array.

An example prior art memory array 1 is shown in FIG. 1. The memory array 1 comprises a plurality of memory units 2, each including a memory cell 3 and a select device 4. The memory cells 2 are interposed at cross-points between rows 6 (also called wordlines or access lines) and columns 5 (also called bitlines or sense lines). In each memory unit 2, the memory cell 3 has a first terminal connected to a wordline 6 and a second terminal connected to a select device 4. The select device 4 has a second terminal connected to a bitline 5.

The select devices may be considered to be switchable components (or switching components), in that they may switch a circuit from an "open" configuration to a "closed" configuration. Individual memory cells may be selected by closing an adjacent switching component while creating a voltage differential between a wordline and a bitline.

It is desired to develop improved switching components, and in some aspects to develop improved switching components suitable for utilization as select devices.

DETAILED DESCRIPTION OF THE ILLUSTRATED EMBODIMENTS

Some embodiments include switching components which comprise semiconductor material between a pair of electrodes. The semiconductor material may be, for example, silicon; and in some embodiments may be doped with one or more of nitrogen, oxygen, germanium and carbon. An advantage of the switching components described herein is that such may have current versus voltage characteristics which include snap-back voltage behavior.

Figure 2:
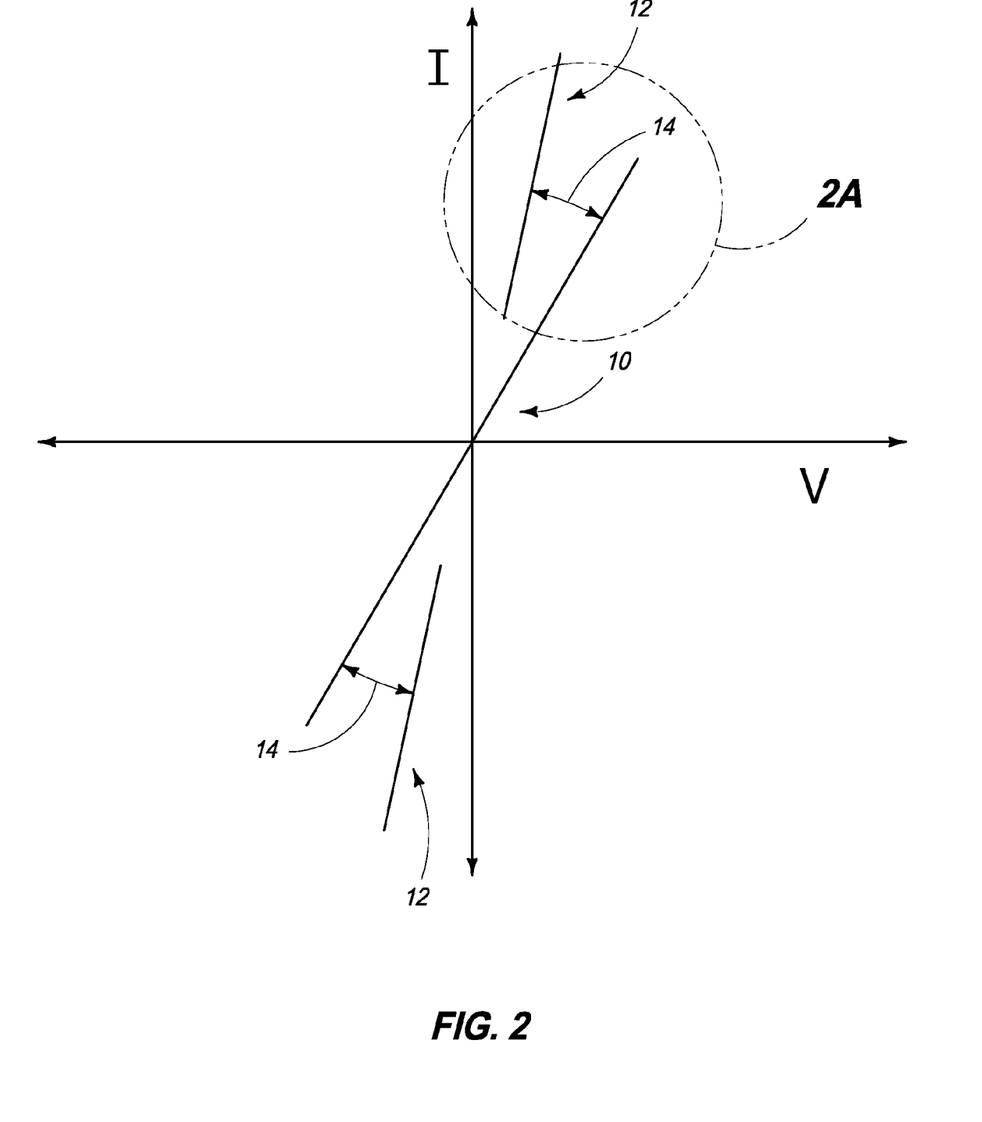
FIG. 2 graphically illustrates a relationship between current (I) and voltage (V) for an example embodiment component having snap-back characteristics.

FIG. 2 graphically illustrates current (I) versus voltage (V) of an example embodiment device exhibiting snap-back voltage behavior. Specifically, positive current flow through the device increases with increasing positive voltage along a first path 10 until sufficient voltage is achieved to jump the device to a second path 12. The illustrated device is symmetric, so that paths 10 and 12 also interchange with one another utilizing negative voltage and negative current flow. Snap-back voltage regimes are diagrammatically illustrated with double-headed arrows 14.

Figure 2A:
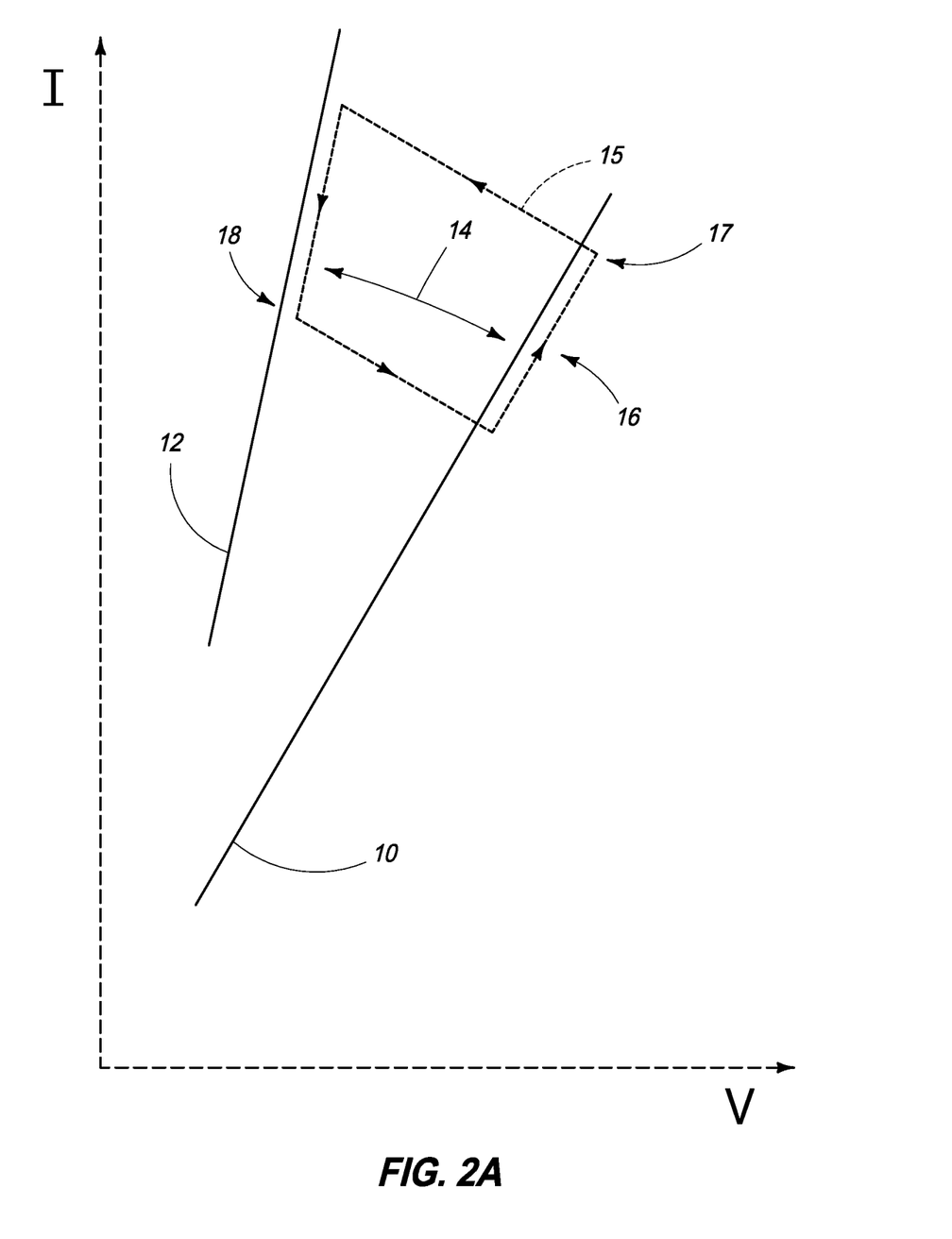
FIG. 2A shows an expanded region from the graph of FIG. 2.

The voltage at which the device of FIG. 2 transitions from path 12 back to path 10 may be different than that where the device transitions from path 10 to path 12, as shown in FIG. 2A. Specifically, FIG. 2A utilizes a dashed-line trail 15 to diagrammatically illustrate current versus voltage behavior of the example device. The trail comprises a region 16 along the first path 10, and then jumps to the second path 12 at a threshold voltage 17. Subsequently, the trail follows the second path 12 downwardly during decrease in voltage until a holding voltage 18 is reached whereupon the trail jumps back to the first path. A snap-back voltage may be defined as a voltage difference between the holding voltage 18 and the threshold voltage 17.

Switching components exhibiting the snap-back behavior of FIGS. 2 and 2A may be advantageous for utilization as select devices in memory units. Specifically, the switching components may exhibit behavior such that a selected memory cell will have much higher current flow then adjacent non-selected memory cells, which may improve access times and/or improve reliability relative to conventional systems.

Some example embodiment switching components are described with reference to FIGS. 3-11.

Figure 3:
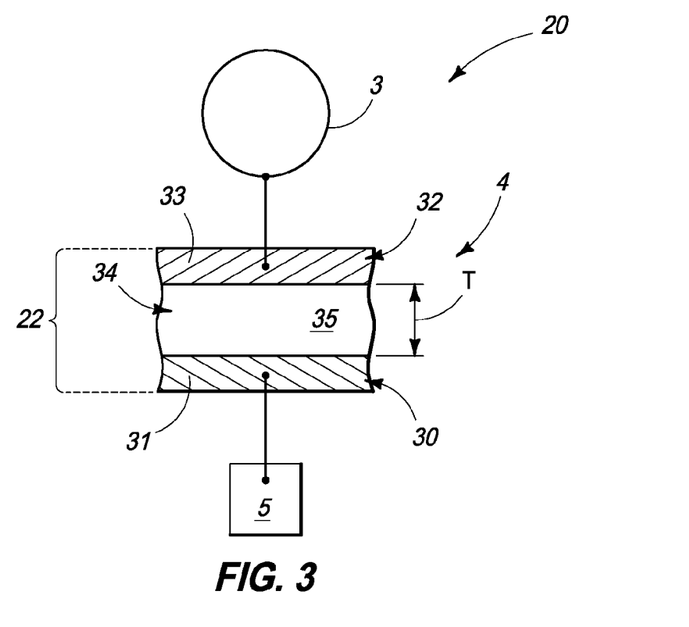
FIG. 3 diagrammatically illustrates an example embodiment switching component incorporated into a memory unit.

Referring to FIG. 3, a region of a memory array 20 is shown to comprise a switching component 22 electrically coupled to a bitline 5 and a memory cell 3. The switching component is thus configured for utilization as a select device 4 of the type described above with reference to FIG. 1.

Switching component 22 comprises a pair of electrodes 30 and 32, and a selector region 34 between the electrodes.

The electrodes 30 and 32 may be referred to as a first electrode and a second electrode, respectively. The electrodes 30 and 32 comprise electrode compositions 31 and 33, respectively. Such electrode compositions may be the same as one another, or may be different than one another.

In some embodiments, one or both of the electrodes may comprise, consist essentially of, or consist of carbon; either alone or in combination with nitrogen. If nitrogen is present, it may be present to less than or equal to about 75 atomic percent.

In some embodiments, one or both of the electrodes may comprise one or more of Ta, Ti and W, in combination with nitrogen. The nitrogen may be present to less than or equal to about 75 atomic percent. In some embodiments, one or both of the electrodes may comprise, consist essentially of, or consist of one or more of TaN, TiN and WN; in combination with one or more of O, C and Al. The formulas TaN, TiN and WN are utilized to indicate elemental components, rather than indicating any particular stoichiometry.

The selector region 34 comprises selector material 35. Such material includes semiconductor, and in some embodiments may comprise, consist essentially of, or consist of silicon doped with one or more of nitrogen, oxygen, germanium and carbon. In embodiments in which the selector material comprises silicon doped with nitrogen and/or oxygen, a total concentration of dopant may be within a range of from greater than zero atomic percent to about 10 atomic percent. In embodiments in which the selector material comprises silicon doped with one or both of carbon and germanium, the dopant may be present to a total concentration within a range of from greater than zero atomic percent to about 50 atomic percent (and in some embodiments may be present within a range of from greater than about one atomic percent to about 50 atomic percent).

The selector material 35 comprises a thickness "T"; which in some embodiments may be within a range of from about 20 Å to about 350 Å. It can be desired that the material 35 be kept relatively thin, provided enough of the material is present for desired switching characteristics. The switching component 22 may have better scalability for higher levels of integration if the device is kept compact; and further the switching component may have better durability (for instance, less susceptibility to tipping) if it is kept compact. In some embodiments, it is found that a relatively thin layer of doped silicon (for instance, silicon doped with nitrogen and/or with one or more of oxygen, carbon and germanium) can match performance characteristics of a thicker layer of undoped silicon in the switching devices described herein.

In the shown embodiment, the selector region 34 comprises a single homogeneous selector material 35 that directly contacts each of the electrodes 30 and 32. In other embodiments, (for instance, embodiments discussed below with reference to FIGS. 4 and 5) the selector region may comprise two or more different materials.

Some example switching components 22 having only a single homogeneous selector material 34 are shown in FIGS. 6A, 7A, 8A, 9A and 10A. The electrodes 30 and 32 shown in such embodiments may comprise any of the electrode compositions described above. For instance, in some example embodiments, the electrodes may comprise, consist essentially of, or consist of carbon.

Figure 4:
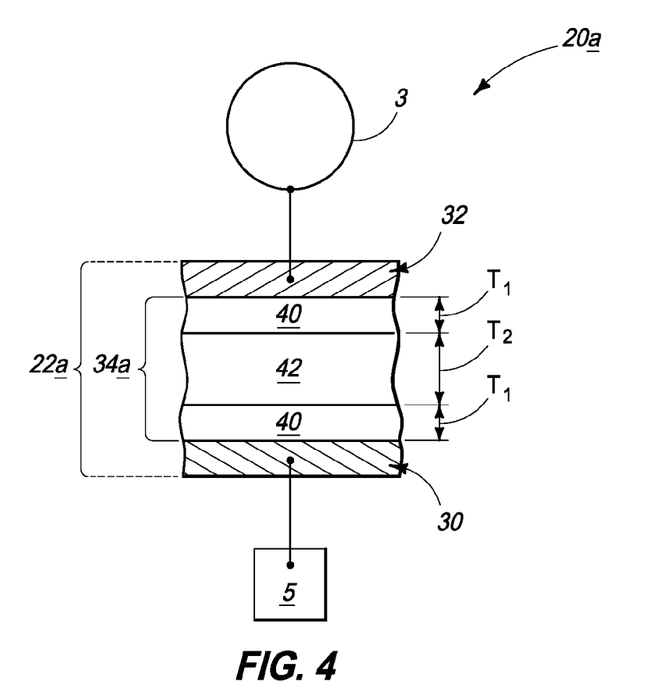
FIG. 4 diagrammatically illustrates another example embodiment switching component incorporated into a memory unit.

Referring to FIG. 4, a region of a memory array 20a is shown to comprise a switching component 22a electrically coupled to the bitline 5 and the memory cell 3. The switching component is thus configured for utilization as a select device 4 of the type described above with reference to FIG. 1.

Switching component 22a comprises electrodes 30 and 32, and comprises a selector region 34a between the electrodes.

The electrodes 30 and 32 may comprise the same electrode compositions discussed above with reference to FIG. 3.

The selector region 34a comprises alternating materials 40 and 42. In some embodiments, the materials 40 and 42 may be referred to as first and second materials, respectively. At least one of the materials comprises semiconductor, and such material may comprise any of the compositions discussed above regarding material 35 of FIG. 3.

Some example embodiments of switching components 22a having selector regions 34a with alternating first and second materials 40 and 42 are shown in FIGS. 6B, 6C, 7B, 7C, 8B, 8C, 9B, 9C, 10B and 10C.

Figure 6A:
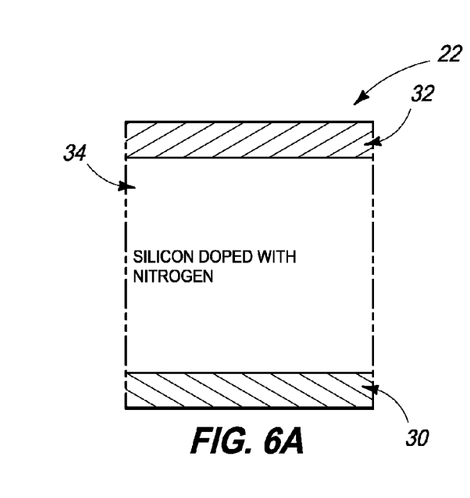
FIGS. 6A-E diagrammatically illustrate a series of example embodiment switching components.
Figure 6B:
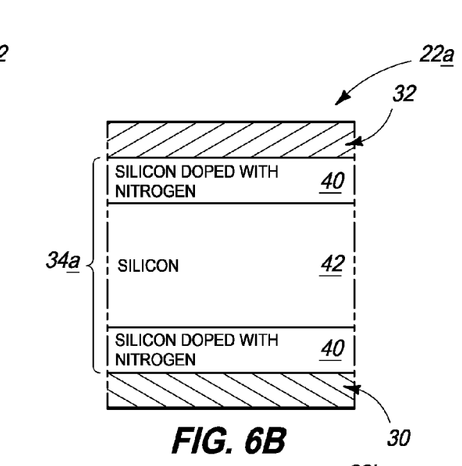
Figure 6C:
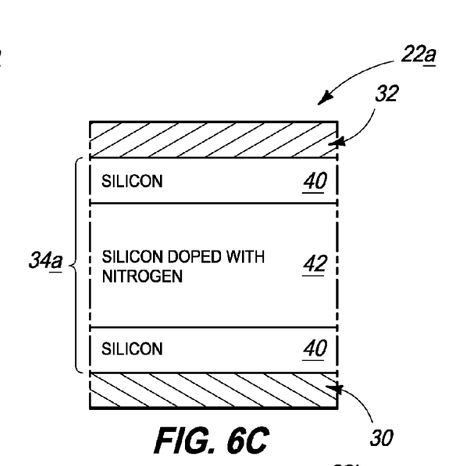
Figure 6D:
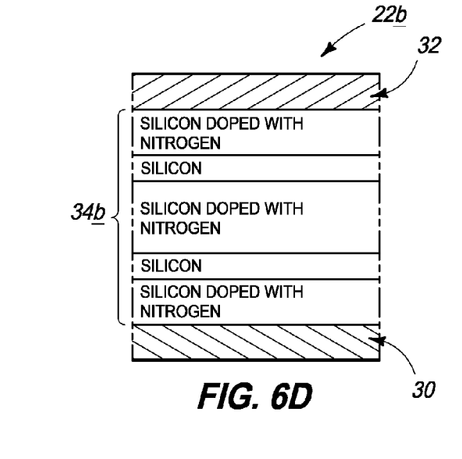
Figure 6E:
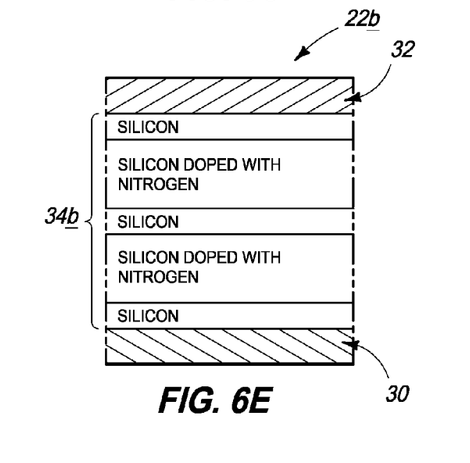

The embodiments of FIGS. 6B and 6C show that in some embodiments one of materials 40 and 42 may consist of, or consist essentially of silicon; while the other comprises silicon doped with nitrogen. The silicon may be directly against the electrodes in some embodiments, and the silicon doped with nitrogen may be directly against the electrodes in other embodiments. In some embodiments, the silicon doped with nitrogen may comprise nitrogen to a concentration within a range of from greater than zero atomic percent to less than or equal to about 10 atomic percent.

Figure 7A:
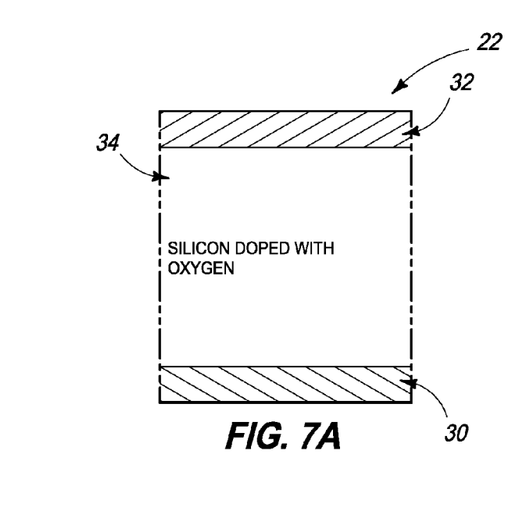
FIGS. 7A-E diagrammatically illustrate another series of example embodiment switching components.
Figure 7B:
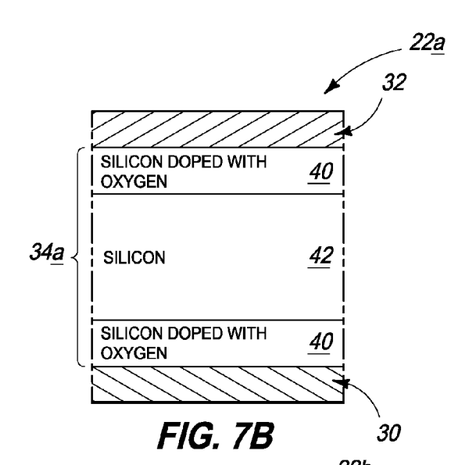
Figure 7C:
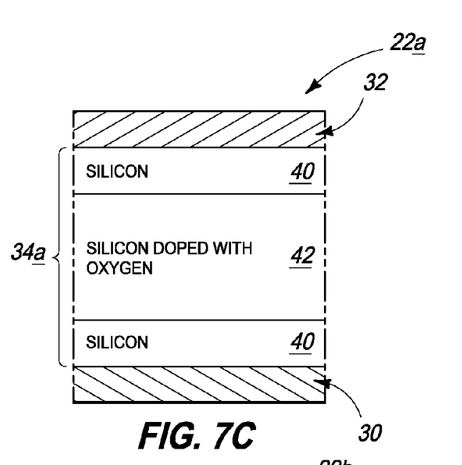
Figure 7D:
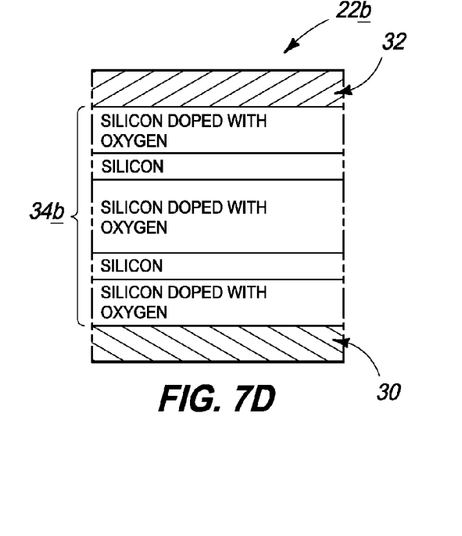
Figure 7E:
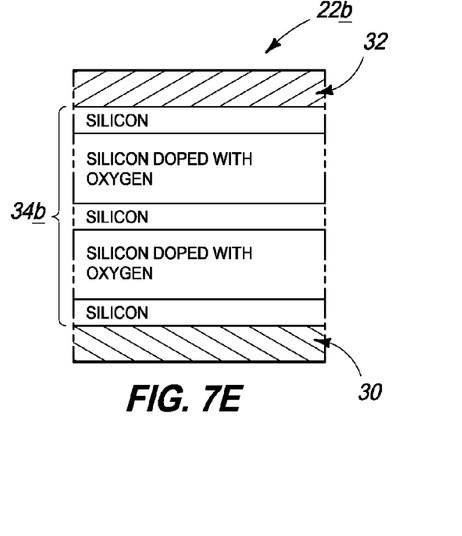

The embodiments of FIGS. 7B and 7C show that in some embodiments one of materials 40 and 42 may consist of, or consist essentially of silicon; while the other comprises silicon doped with oxygen. The silicon may be directly against the electrodes in some embodiments, and the silicon doped with oxygen may be directly against the electrodes in other embodiments. In some embodiments, the silicon doped with oxygen may comprise oxygen to a concentration within a range of from greater than zero atomic percent to less than or equal to about 10 atomic percent.

Figure 8A:
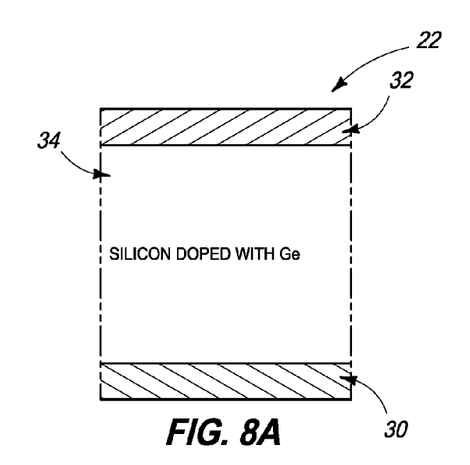
FIGS. 8A-E diagrammatically illustrate another series of example embodiment switching components.
Figure 8B:
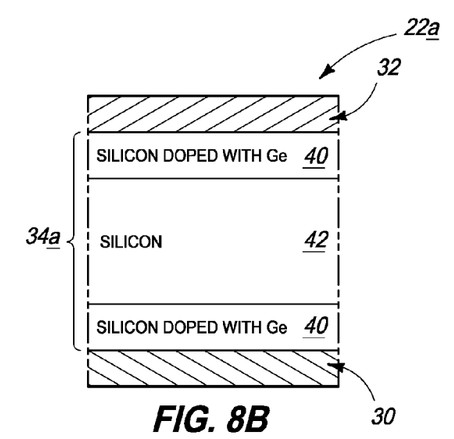
Figure 8C:
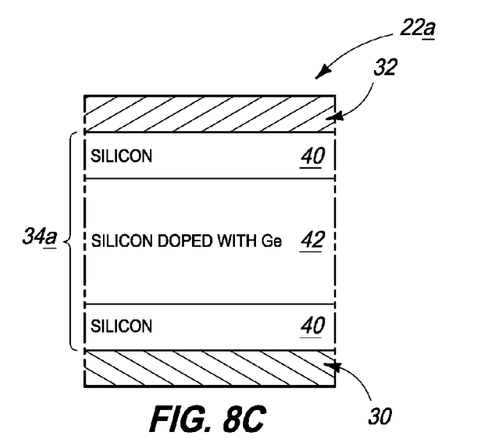
Figure 8D:
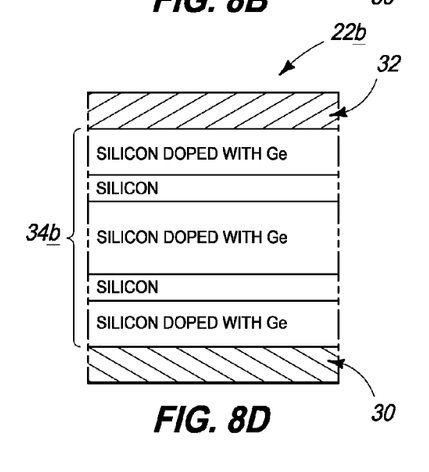
Figure 8E:
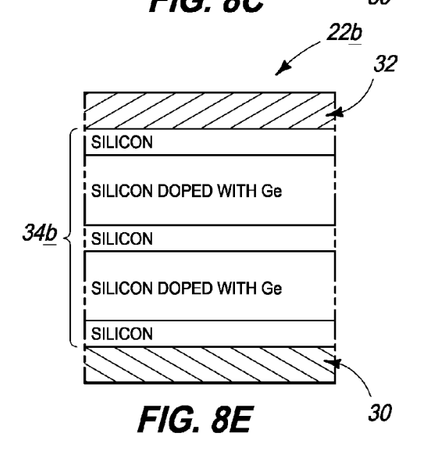

The embodiments of FIGS. 8B and 8C show that in some embodiments one of materials 40 and 42 may consist of, or consist essentially of silicon; while the other comprises silicon doped with germanium. The silicon may be directly against the electrodes in some embodiments, and the silicon doped with germanium may be directly against the electrodes in other embodiments. In some embodiments, the silicon doped with germanium may comprise germanium to a concentration within a range of from greater than or equal to about one atomic percent to less than or equal to about 50 atomic percent.

Figure 9A:
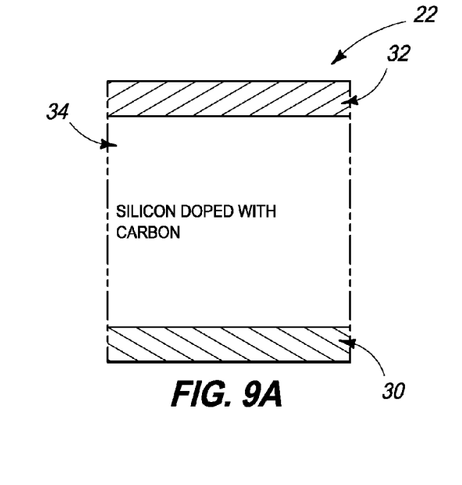
FIGS. 9A-E diagrammatically illustrate another series of example embodiment switching components.
Figure 9B:
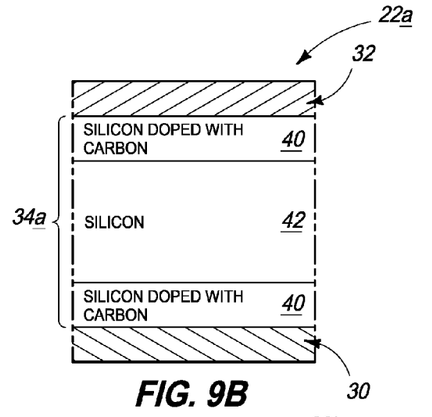
Figure 9C:
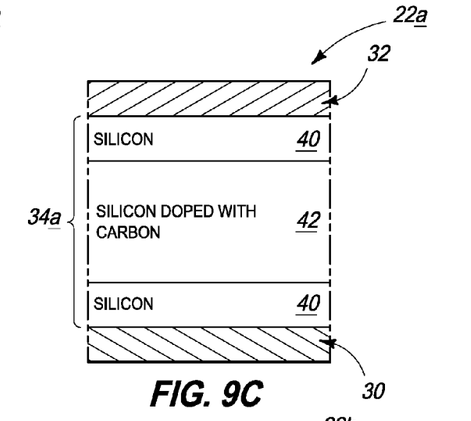
Figure 9D:
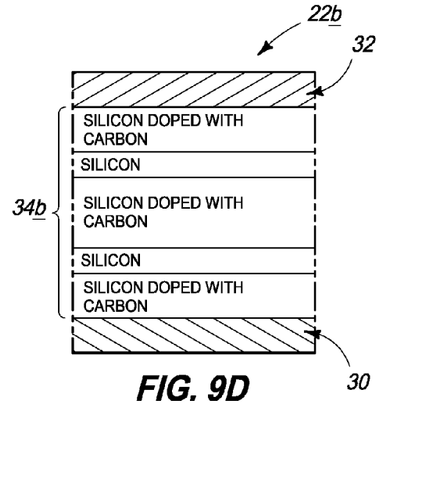
Figure 9E:
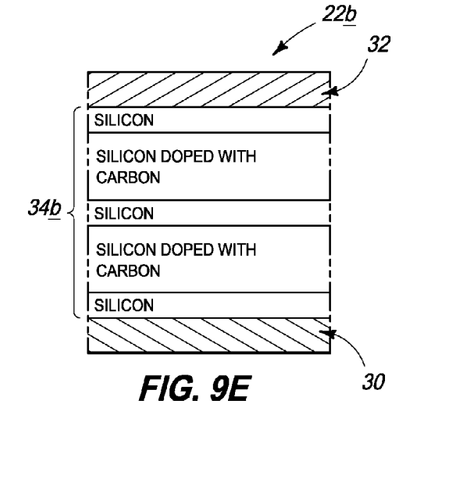

The embodiments of FIGS. 9B and 9C show that in some embodiments one of materials 40 and 42 may consist of, or consist essentially of silicon; while the other comprises silicon doped with carbon. The silicon may be directly against the electrodes in some embodiments, and the silicon doped with carbon may be directly against the electrodes in other embodiments. In some embodiments, the silicon doped with carbon may comprise carbon to a concentration within a range of from greater than or equal to about one atomic percent to less than or equal to about 50 atomic percent.

Figure 10A:
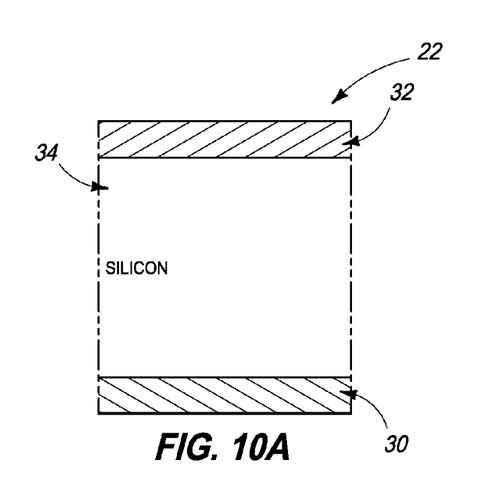
FIGS. 10A-E diagrammatically illustrate another series of example embodiment switching components.
Figure 10B:
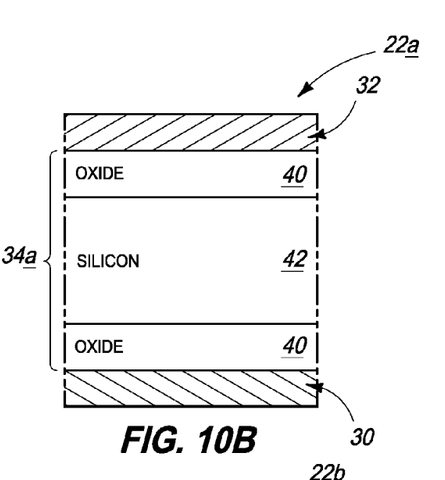
Figure 10C:
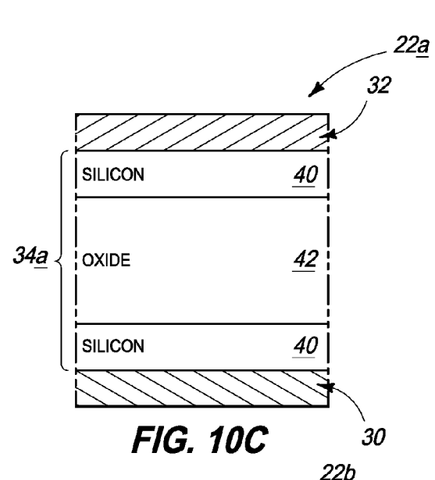
Figure 10D:
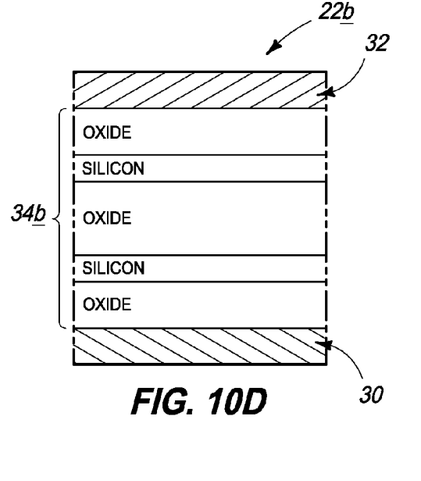
Figure 10E:
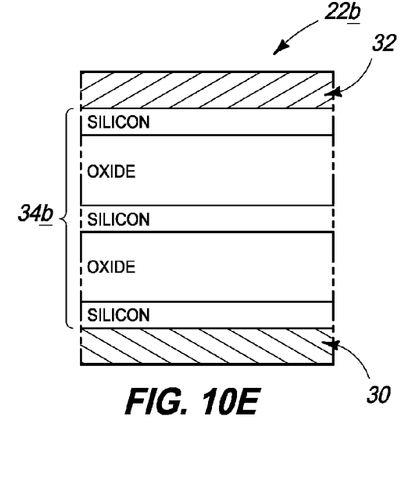
Figure 11A:
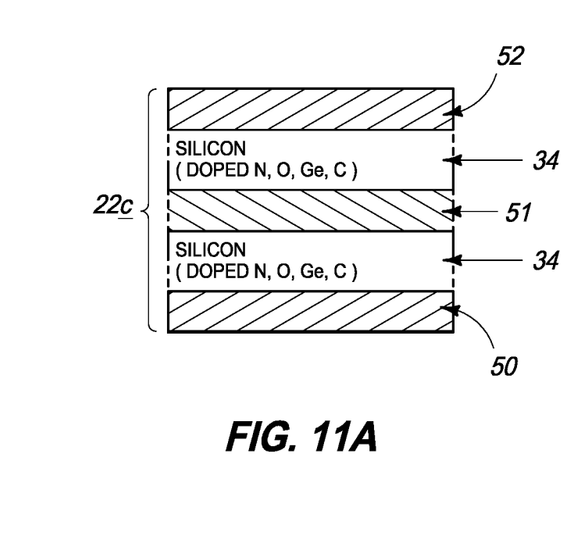
FIGS. 11A and B diagrammatically illustrate another series of example embodiment switching components.
Figure 11B:
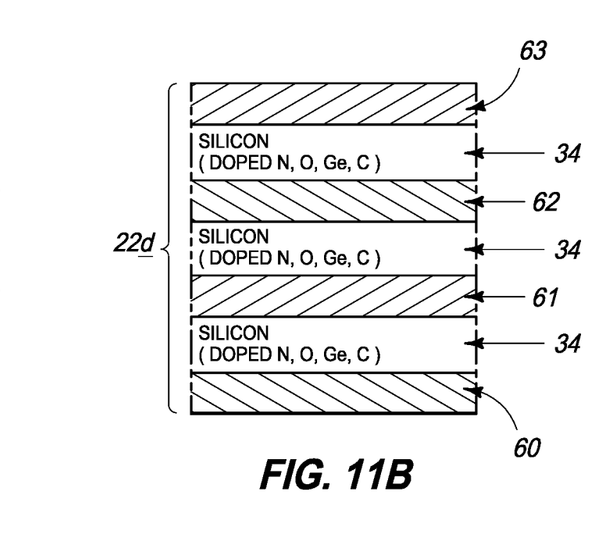

The embodiments of FIGS. 10B and 10C show that in some embodiments one of materials 40 and 42 may comprise silicon (which may or may not be doped with one or more of nitrogen, oxygen, germanium and carbon); while the other comprises oxide (which may comprises one or more oxides selected from the group consisting of hafnium oxide, zirconium oxide, strontium oxide, titanium oxide and lanthanum oxide). The silicon may be directly against the electrodes in some embodiments, and the oxide may be directly against the electrodes in other embodiments.

The selector materials 40 and 42 of FIG. 4 are shown to comprise thicknesses $T_1$ and $T_2$; which in some embodiments may be within a range of from about 3 Å to about 350 Å. In some embodiments, materials corresponding to the oxides of FIGS. 10B and 10C may have thicknesses of from about 3 Å to about 20 Å, while other materials of FIGS. 6-9 may have thicknesses of from about 20 Å to about 350 Å. Although both sections of material 40 are shown having the same thickness as one another, in other embodiments one of the sections may have a different thickness than the other. Further, although material 42 is shown having a different thickness than material 40, in other embodiments material 42 may have about the same thickness as material 40.

Figure 5:
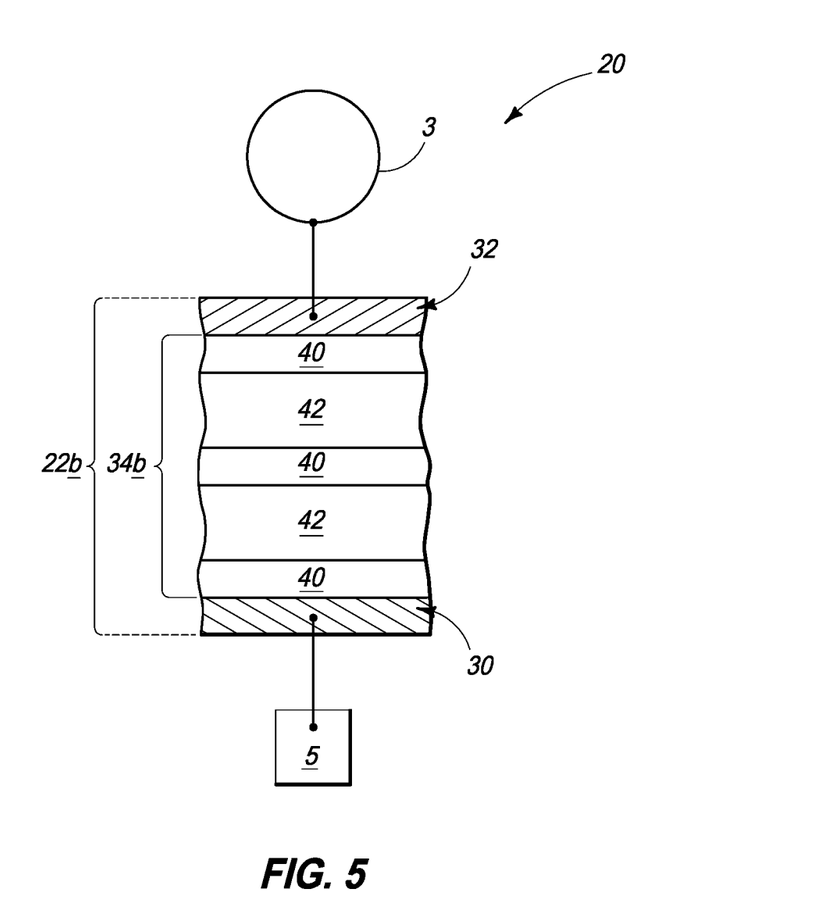
FIG. 5 diagrammatically illustrates another example embodiment switching component incorporated into a memory unit.

The embodiment of FIG. 4 may be considered to be an example of a construction in which a selector region comprises a stack of first and second materials arranged in the configuration first material/second material/first material. In contrast, FIG. 5 illustrates a switching component 22b having selector region 34b having a larger stack comprising first material/second material/first material/second material/first material. In other embodiments, other stacks besides those shown in FIGS. 4 and 5 may be utilized.

The materials 40 and 42 of FIG. 5 may be the same as those described above with reference to FIG. 4; and FIGS. 6D, 6E, 7D, 7E, 8D, 8E, 9D, 9E, 10D and 10E illustrate some example configurations for the selector region 34b of FIG. 5 relative to example switching components 22b.

In some embodiments, switching components may be formed to comprise multiple constructions of the types described above in FIGS. 3-10, with the constructions being stacked one atop another. For instance, FIGS. 11A and B illustrate example switching components 22c and 22d having electrodes 50-52 and 60-63; and comprising semiconductor material 34 between the electrodes. In the illustrated configuration, the semiconductor material comprises silicon doped with one or more of nitrogen, oxygen, germanium and carbon. Although the same semiconductor material 34 is shown utilized throughout the constructions, in other embodiments different semiconductor materials may be utilized. The electrodes 50-52 and 60-63 may comprise any of the compositions described above relative to electrodes 30 and 32 of FIG. 3.

The electronic devices discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a switching component comprising a selector region between a pair of electrodes. The selector region comprises silicon doped with one or more of nitrogen, oxygen, germanium and carbon.

Some embodiments include a switching component comprising a first electrode, a selector region over the first electrode, and a second electrode over the selector region. The selector region comprises a stack of alternating first and second materials, with at least one of the first and second materials comprising semiconductor.

Some embodiments include a memory unit comprising a memory cell and a select device electrically coupled to the memory cell. The select device comprises a selector region between a pair of electrodes. The selector region comprises semiconductor doped with one or more of nitrogen, oxygen, germanium and carbon; and the select device has current versus voltage characteristics which include snap-back voltage behavior.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A switching component, comprising:
a selector region between a pair of electrodes;
wherein the selector region comprises silicon doped with nitrogen; and
wherein the dopant comprises nitrogen to a total concentration within a range of from greater than 0 atomic percent to about 10 atomic percent.

2. The switching component of claim 1 wherein the electrodes are a same composition as one another.

3. The switching component of claim 1 wherein the electrodes are different compositions relative to one another.

4. The switching component of claim 1 wherein at least one of the electrodes comprises one or more of Ta, Ti and W, in combination with nitrogen.

5. The switching component of claim 1 wherein said at least one of the electrodes further comprises one or more of O, C and Al.

6. The switching component of claim 1 wherein both of the electrodes comprise carbon.

7. The switching component of claim 1 wherein at least one of the electrodes consists of carbon and nitrogen.

8. The switching component of claim 1 wherein the selector region is a single homogenous material that directly contacts each electrode of said pair of electrodes.

9. The switching component of claim 1 wherein both electrodes of said pair consist of carbon.

10. The switching component of claim 1 wherein the selector region comprises two or more different materials.

11. A switching component, comprising:
a first electrode;
a selector region over the first electrode;
a second electrode over the selector region;
wherein the selector region comprises a stack of alternating first and second materials, with one of the first and second materials comprising semiconductor and the other of the first and second materials comprising nitrogen-doped semiconductor; and
wherein said other of the first and second materials comprises silicon doped with nitrogen to a concentration within a range of from greater than 0 atomic percent to about 10 atomic percent; and wherein said one of the first and second materials consists of silicon.

12. The switching component of claim 11 wherein the selector region comprises the nitrogen-doped silicon directly against each of the electrodes.

13. The switching component of claim 11 wherein the selector region comprises the material consisting of silicon directly against each of the electrodes.

14. The switching component of claim 11 wherein the stack comprises first material/second material/first material.

15. The switching component of claim 11 wherein the stack comprises first material/second material/first material/second material/first material.

16. A memory unit, comprising:
a memory cell;
a select device electrically coupled to the memory cell; the select device comprising a selector region between a pair of electrodes, wherein the selector region comprises semiconductor doped with nitrogen and has current versus voltage characteristics which include snap-back voltage behavior;
wherein the selector region is a single homogenous material that directly contacts each electrode of said pair of electrodes; and
wherein the single homogenous material comprises silicon doped with nitrogen to a concentration within a range of from greater than 0 atomic percent to about 10 atomic percent.

17. The memory unit of claim 16 wherein both electrodes of said pair consist of carbon.

* * * * *